United States Patent
Fujii et al.

(10) Patent No.: US 9,082,938 B2
(45) Date of Patent: Jul. 14, 2015

(54) LIGHT EMITTING DEVICE

(71) Applicant: Kabushiki Kaisha Toshiba, Minato-ku (JP)

(72) Inventors: Takayoshi Fujii, Kanagawa-ken (JP); Haruhiko Okazaki, Ishikawa-ken (JP); Toshihiro Kuroki, Ishikawa-ken (JP); Toshitake Kitagawa, Kanagawa-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/208,028

(22) Filed: Mar. 13, 2014

(65) Prior Publication Data

US 2015/0076543 A1    Mar. 19, 2015

(30) Foreign Application Priority Data

Sep. 19, 2013  (JP) .................................. 2013-194619

(51) Int. Cl.
*H01L 33/00* (2010.01)
*H01L 33/50* (2010.01)

(52) U.S. Cl.
CPC ..................................... *H01L 33/50* (2013.01)

(58) Field of Classification Search
None
See application file for complete search history.

(56) References Cited

U.S. PATENT DOCUMENTS

| | | | |
|---|---|---|---|
| 2010/0109022 A1* | 5/2010 | Kim ................................. | 257/84 |
| 2012/0098005 A1* | 4/2012 | Chan et al. ....................... | 257/98 |
| 2012/0305956 A1* | 12/2012 | Liu et al. ........................... | 257/98 |
| 2013/0049572 A1* | 2/2013 | Kim et al. ....................... | 313/498 |

FOREIGN PATENT DOCUMENTS

| | | |
|---|---|---|
| JP | 2000-216434 | 8/2000 |
| JP | 2007-59852 A | 3/2007 |
| JP | 2010-56337 A | 3/2010 |

* cited by examiner

*Primary Examiner* — Bilkis Jahan
*Assistant Examiner* — Kevin Quinto
(74) *Attorney, Agent, or Firm* — Oblon, McClelland, Maier & Neustadt, L.L.P.

(57) ABSTRACT

According to one embodiment, a light emitting device includes a base, a light emitting element, and a fluorescent body-containing layer. The light emitting element is installed on the base, has an upper surface and a lower surface, and includes a light emitting unit on the upper surface. The fluorescent body-containing layer is provided on the light emitting element and has a lower surface having an area smaller than an area of the light emitting unit and an upper surface having an area larger than an area of the light emitting unit.

19 Claims, 8 Drawing Sheets

LIGHT EMITTING DEVICE

CROSS-REFERENCE TO RELATED APPLICATIONS

This application is based upon and claims the benefit of priority from Japanese Patent Application No. 2013-194619, filed on Sep. 19, 2013; the entire contents of which are incorporated herein by reference.

FIELD

Embodiments described herein relate generally to alight emitting device.

BACKGROUND

A light emitting device including a light emitting element and a fluorescent body generally has a structure in which the light emitting element is provided on a base and a fluorescent body layer is provided on the light emitting element. A mixed light of the light emitted from the light emitting element and the light emitted from the fluorescent body layer is emitted from such a light emitting device.

However, in such a light emitting device, what is called a color breakup phenomenon may occur in which the chromaticity of light varies with the angle at which light is emitted from the light emitting element. It is required for the light emitting device to suppress such color breakup.

DETAILED DESCRIPTION

Figure 1A:
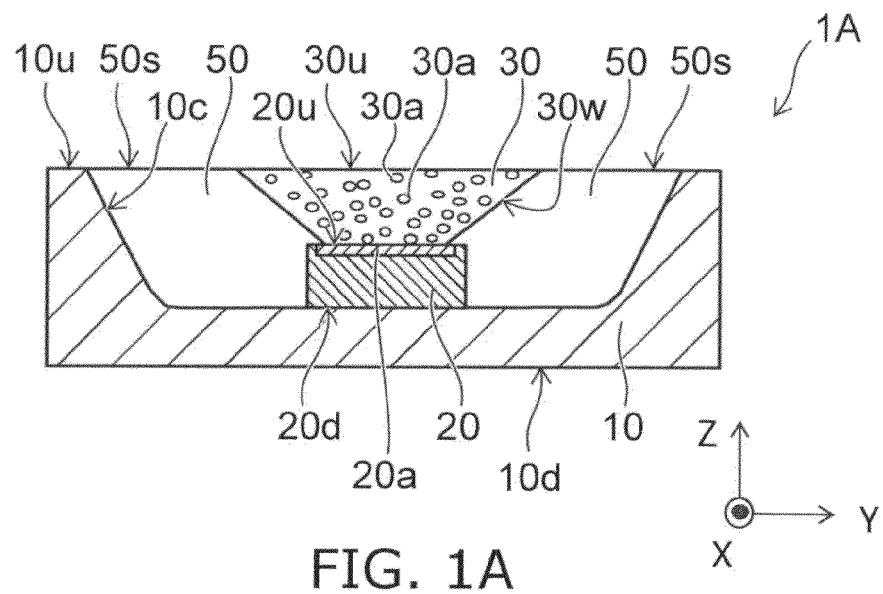
FIG. 1A is a schematic cross-sectional view of a light emitting device according to a first embodiment.

According to one embodiment, a light emitting device includes a base, a light emitting element, and a fluorescent body-containing layer. The light emitting element is installed on the base, has an upper surface and a lower surface, and includes a light emitting unit on the upper surface. The fluorescent body-containing layer is provided on the light emitting element and has a lower surface having an area smaller than an area of the light emitting unit and an upper surface having an area larger than an area of the light emitting unit.

Various embodiments will be described hereinafter with reference to the accompanying drawings. In the following description, identical components are marked with the same reference numerals, and a description of components once described is omitted as appropriate.

First Embodiment

Figure 1B:
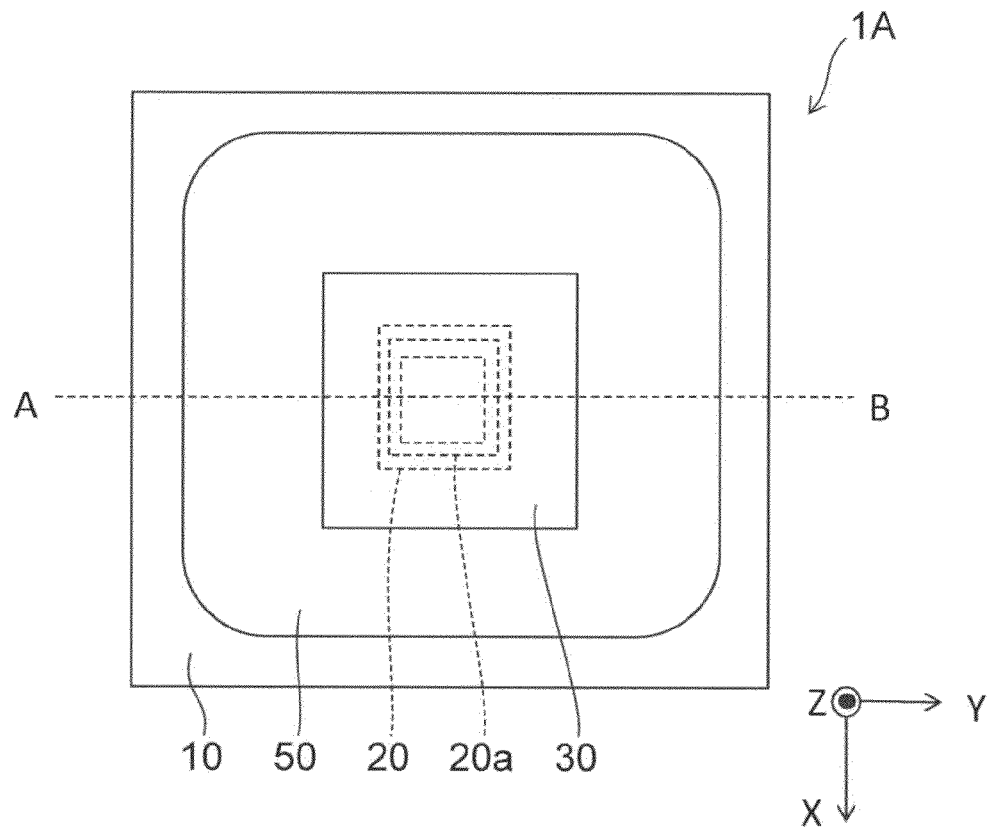
FIG. 1B is a schematic plan view of the light emitting device according to the first embodiment.

FIG. 1A is a schematic cross-sectional view of a light emitting device according to a first embodiment, and FIG. 1B is a schematic plan view of the light emitting device according to the first embodiment.

FIG. 1A shows a cross-sectional view taken along line A-B of FIG. 1B.

In a light emitting device 1A, a light emitting element 20 is installed on the center of a base 10 that is a casing. The base 10 has a recess 10c. The light emitting element 20 is provided in the recess 10c of the base 10. The external shape of the base 10 is a square as viewed from the Z-direction, for example. The external shape of the base 10 as viewed from the Z-direction is not limited to a square, and may be a rectangle, a circle, or an ellipse, for example. The material of the base 10 is a ceramic material, a resin material, a metal, or others, for example.

The light emitting element 20 has an upper surface 20u and a lower surface 20d, and includes a light emitting unit 20a on the upper surface 20u. The light emitting element 20 is an LED (Light Emitting Diode) chip of a nitride-based semiconductor using a semiconductor such as Si as a base, for example. The light emitting element 20 emits light of a blue range (440 nm to 470 nm), for example. In the embodiment, the light emitted from the light emitting unit 20a is referred to as a primary light.

Although the drawings according to the embodiment show an example in which the area of the light emitting unit 20a is smaller than the area of the upper surface 20u of the light emitting element 20, this is only an example and also a configuration in which the entire area of the upper surface 20u of the light emitting element 20 forms the light emitting unit 20a is included in the embodiment.

An interconnection (for example, a lead, a wire, etc.) for supplying an electric potential to an electrode of the light emitting element 20 is connected to the light emitting element 20, but the illustration of the interconnection is omitted in FIGS. 1A and 1B. Since the light emitting unit 20a is provided on the upper surface 20u of the light emitting element 20, the light emitting element 20 may be referred to as a light emitting element of an upper surface light emission type. Such a light emitting element is less expensive than a light emitting element of an upper-side surface light emission type capable of emitting light from the upper surface and the side surface. This is because the light emitting element of the upper-side surface light emission type uses expensive sapphire as its base.

In the light emitting device 1A, a fluorescent body-containing layer 30 in a sheet form is provided on the light emitting element 20. The fluorescent body-containing layer 30 has an upper surface 30u, a lower surface 30d, and a side surface 30w. A fluorescent material 30a that emits yellow fluorescence is dispersed in the fluorescent body-containing layer 30, for example.

Here, the fluorescent material 30a is the following material, for example.
Li(Eu, Sm)W$_2$O$_8$,
(Y, Gd)$_3$, (Al, Ga)$_5$O$_{12}$:Ce$^{3+}$,
Li$_2$SrSiO$_4$:Eu$^{2+}$,
(Sr(Ca, Ba))$_3$SiO$_5$:Eu$^{2+}$,
SrSi$_2$ON$_{2.7}$:Eu$^{2+}$, or the like.

In the fluorescent body-containing layer 30, in addition to the fluorescent material 30a, there may be a material that emits red fluorescence, for example. Examples of the material are as follows.
Y$_2$O$_2$S:Eu,
Y$_2$O$_2$S:Eu+a pigment,
Y$_2$O$_3$:Eu,
Zn$_3$(PO$_4$)$_2$:Mn,
(Zn, Cd)S:Ag+In$_2$O$_3$,
(Y, Gd, Eu)BO$_3$,
(Y, Gd, Eu)$_2$O$_3$,
YVO$_4$:Eu
La$_2$O$_2$S:Eu, Sm,
LaSi$_3$N$_5$:EU$^{2+}$,
α-sialon:Eu$^{2+}$,
CaAlSiN$_3$:Eu$^{2+}$,
CaSiNl$_x$:Eu$^{2+}$,
CaSiN$_x$:Ce$^{2+}$,
M$_2$Si$_5$N$_8$:Eu$^{2+}$,
CaAlSiN$_3$:Eu$^{2+}$,
(SrCa)AlSiN$_3$:Eu$^{x+}$,
Sr$_x$(Si$_y$Al$_3$)$_z$(O$_x$N):Eu$^{x+}$, and the like.

Examples of the material except the fluorescent material contained in the fluorescent body-containing layer 30 include a silicone-based resin, an epoxy resin, a methacrylic resin (PMMA), a polycarbonate (PC), a cyclic polyolefin (COP), an alicyclic acrylic (OZ), a thermosetting resin for lenses of glasses (ADC), an acrylic-based resin, and a fluorine-based resin. This material may contain silicon oxide (SiO$_2$), titanium oxide (TiO$_2$), or the like.

The distance between the upper surface 30u of the fluorescent body-containing layer 30 and the lower surface 10d of the base 10, the distance between the surface (the upper surface 50s) of a transparent resin layer 50 and the lower surface 10d of the base 10, and the thickness of the base 10 are equal. That is, the upper surface 30u of the fluorescent body-containing layer 30, the surface (the upper surface 50s) of the transparent resin layer 50, and the upper surface 10u of the base 10 are flush. Thus, the light emitting device 1A may be referred to as a flat-type light emitting device.

In the light emitting device 1A, the area of the lower surface 30d of the fluorescent body-containing layer 30 is smaller than the area of the light emitting unit 20a of the light emitting element 20. The fluorescent body-containing layer 30 is provided on the light emitting element 20 in such a manner that the center of the fluorescent body-containing layer 30 and the center of the light emitting unit 20a coincide, for example. The area of the upper surface 30u of the fluorescent body-containing layer 30 is larger than the area of the light emitting unit 20a of the light emitting element 20. The cross section of the fluorescent body-containing layer 30 is an inverted trapezoid, for example (FIG. 1A).

Although a square is illustrated as the planar shape of the upper surface 30u of the fluorescent body-containing layer 30 as an example, the planar shape of the upper surface 30u of the fluorescent body-containing layer 30 may be a rectangle, a circle, or an ellipse.

In the light emitting device 1A, a transparent resin layer is provided in the recess 10c of the base 10. The transparent resin layer 50 is in contact with the side surface 30w of the fluorescent body-containing layer 30, and surrounds the side surface 30w of the fluorescent body-containing layer 30. The transparent resin layer 50 is in contact with part of the light emitting element 20.

Examples of the material of the transparent resin layer 50 include a silicone-based resin, an epoxy resin, a methacrylic resin (PMMA), a polycarbonate (PC), a cyclic polyolefin (COP), an alicyclic acrylic (OZ), a thermosetting resin for lenses of glasses (ADC), an acrylic-based resin, and a fluorine-based resin. The material of the transparent resin layer 50 may contain silicon oxide (SiO$_2$), titanium oxide (TiO$_2$), or the like.

Of the primary light emitted from the light emitting element 20, the light absorbed by the fluorescent body-containing layer 30 is converted to a secondary light having a different wavelength from the primary light. Thereby, light in which the color of the primary light and the color of the secondary light are mixed can be obtained above the fluorescent body-containing layer 30. When the primary light is blue and the secondary light is yellow, the light emitting device 1A emits light in which these lights are mixed (for example, white light).

On the other hand, in the light emitting device 1A, the primary light emitted from the light emitting unit 20a may also directly reach the surface 50s of the transparent resin layer 50 without passing through the fluorescent body-containing layer 30 (described later).

Before describing operations of the light emitting device 1A, operations of a light emitting device according to a reference example are described.

Figure 2A:
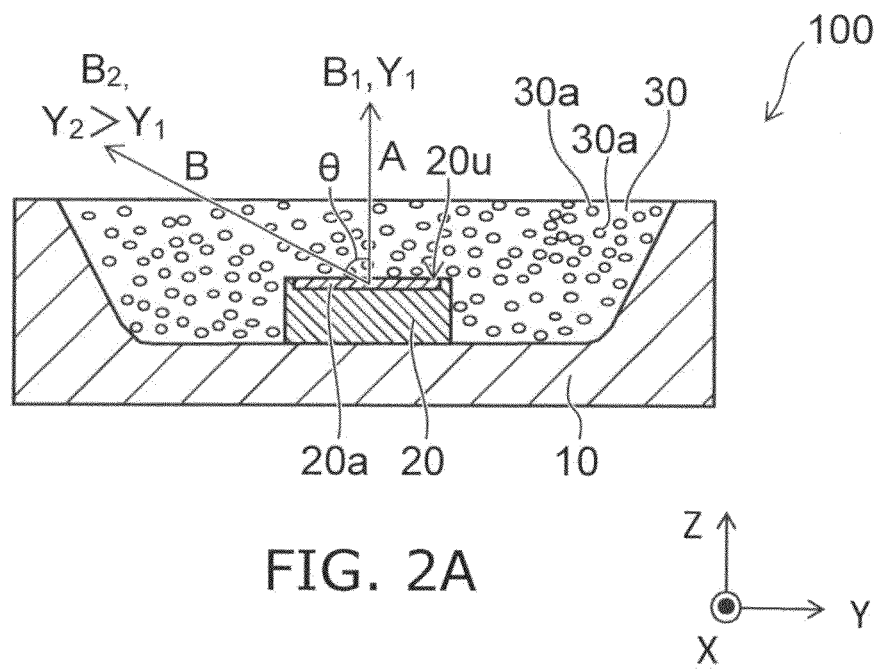
FIG. 2A is a schematic cross-sectional view showing the operation of the light emitting device according to the reference example.
Figure 2B:
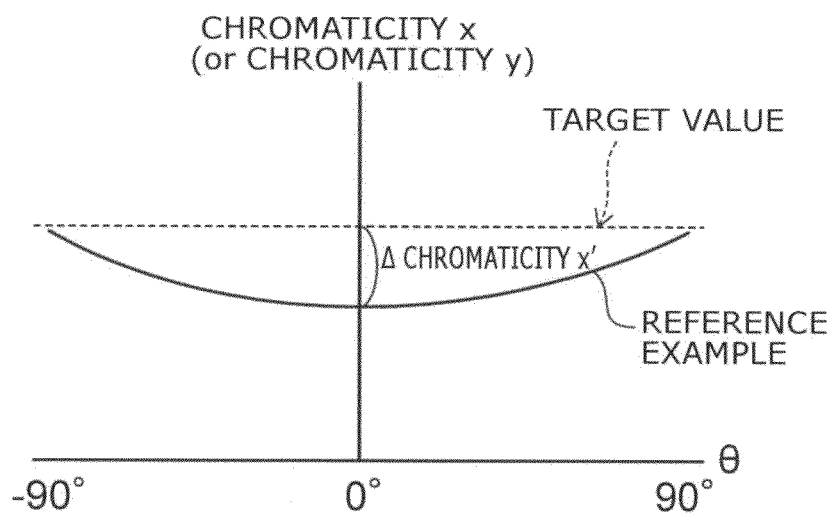
FIG. 2B shows the angle dependence of the chromaticity of the light emitting device according to the reference example.

FIG. 2A is a schematic cross-sectional view showing the operation of the light emitting device according to the reference example, and FIG. 2B shows the angle dependence of the chromaticity of the light emitting device according to the reference example.

The horizontal axis of FIG. 2B represents the angle from the perpendicular to the upper surface of the light emitting element 20 in the Y-direction (possibly the X-direction), and the vertical axis represents the (chromaticity x) in the standard value. The (chromaticity x) may be replaced with the (chromaticity y). The angle is defined by the angle θ shown in FIG. 2A. Although in FIG. 2A a state where light is emitted from only one point of the upper surface of the light emitting element 20 is illustrated as light emitted in the direction perpendicular to the upper surface 20u of the light emitting element 20, it goes without saying that the primary light is emitted from the entire area of the light emitting unit 20a of the light emitting element 20.

In a light emitting device 100 according to the reference example, the transparent resin layer 50 is not provided, and the fluorescent body-containing layer 30 is provided in the recess 10c.

In the light emitting device 100, the light emitted perpendicularly from the upper surface 20u of the light emitting element 20 to the outside of the light emitting device 100 (the light emitted in the direction of arrow A) has a primary light (blue light B$_1$) emitted from the light emitting unit 20a of the light emitting element 20 and a secondary light (yellow light Y$_1$) emitted by the fluorescent body-containing layer 30 that has absorbed the primary light.

By appropriately adjusting the light quantity ratio (I$_{B1}$/I$_{Y2}$) between the primary light and the secondary light, white light is obtained in the light A emitted perpendicularly from the upper surface 20u of the light emitting element 20 to the outside of the light emitting device 100.

In the light emitting device 100, there is also light emitted from the upper surface 20u of the light emitting element 20 to the outside of the light emitting device 100 with a certain angle θ (the light emitted in the direction of arrow B). The light B has a primary light (blue light $B_2$) emitted from the light emitting unit 20a of the light emitting element 20 with the angle θ and a secondary light (yellow light $Y_2$) emitted by the fluorescent body-containing layer 30 that has absorbed the primary light.

Here, if the light quantity ratio ($I_{B2}/I_{Y2}$) between the primary light and the secondary light emitted with the angle θ is equal to the light quantity ratio ($I_{B1}/I_{Y2}$), also the light emitted from the upper surface 20u of the light emitting element 20 to the outside of the light emitting device 100 with the certain θ has a color substantially the same as the light emitted perpendicularly from the upper surface 20u of the light emitting element 20 to the outside of the light emitting device 100. This state is shown as the target value in FIG. 2B.

However, the primary light emitted in the direction of arrow B passes through a longer path in the fluorescent body-containing layer 30 than the primary light emitted in the direction of arrow A. Accordingly, in the direction of arrow B, the primary light may be more absorbed in the fluorescent material than in the direction of arrow A, and the secondary light (yellow light $Y_2$) may be stronger than the secondary light (yellow light $Y_1$) ($Y_2 > Y_1$). In other words, as the angle θ becomes wider, the balance between the primary light and the secondary light is broken more, and yellow light becomes stronger.

Therefore, in the light emitting device 100, as shown in FIG. 2B there is a case where the (chromaticity x) near the angle of 0 degrees is lowest and the (chromaticity x) increases as the angle θ becomes nearer to the angle of 90 degrees. For example, the difference Δ(chromaticity x') between the (chromaticity x) and the target value at the angle of 0 degrees may be 0.1 or more. This means that blue is relatively strong near the angle of 0 degrees and yellow is relatively strong near the angle of 90 degrees.

Figure 3A:
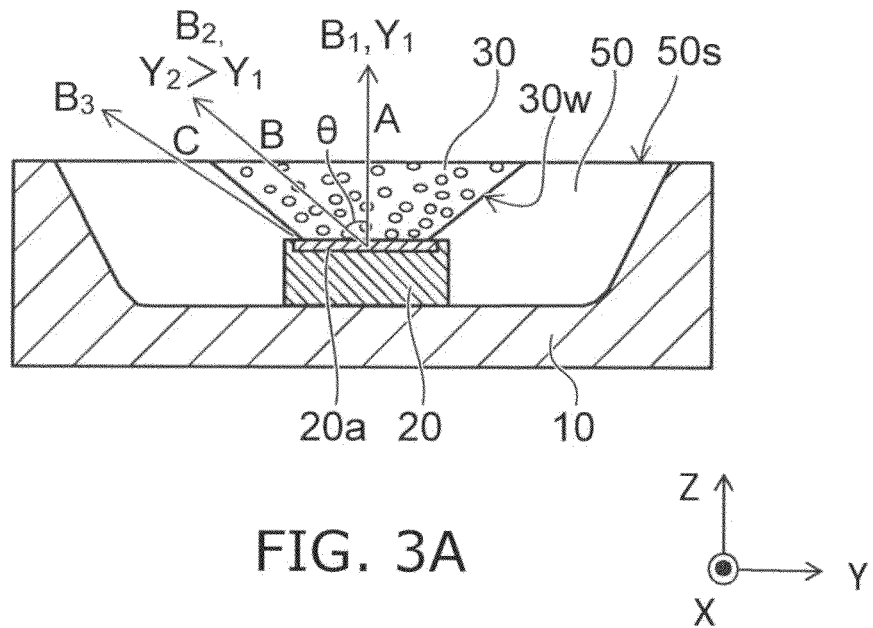
FIG. 3A is a schematic cross-sectional view showing the operation of the light emitting device according to the first embodiment.
Figure 3B:
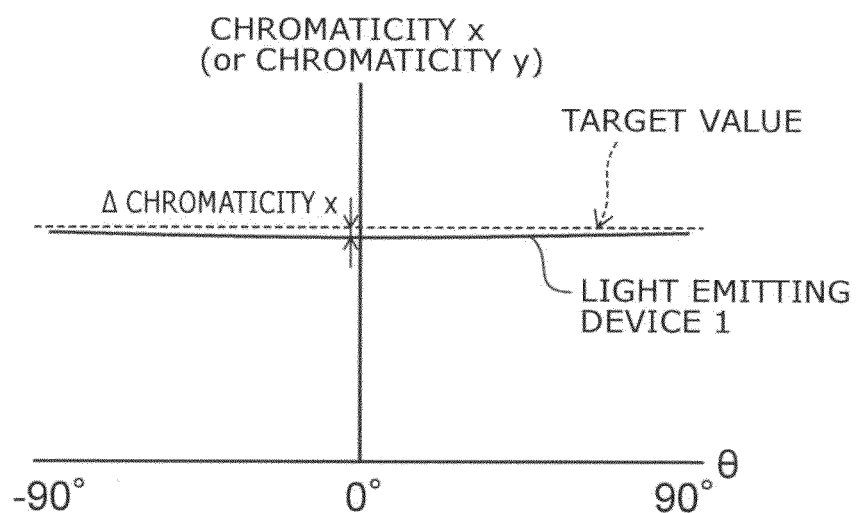
FIG. 3B shows the angle dependence of the chromaticity of the light emitting device according to the first embodiment.

FIG. 3A is a schematic cross-sectional view showing the operation of the light emitting device according to the first embodiment, and FIG. 3B shows the angle dependence of the chromaticity of the light emitting device according to the first embodiment.

The horizontal axis of FIG. 3B represents the angle θ from the perpendicular to the upper surface of the light emitting element 20 in the Y-direction (possibly the X-direction), and the vertical axis represents the (chromaticity x) in the standard value. The (chromaticity x) may be replaced with the (chromaticity y). The angle is defined by the angle θ shown in FIG. 2A.

Similarly to the light emitting device 100, also in the light emitting device 1A, the light emitted perpendicularly from the upper surface 20u of the light emitting element 20 to the outside of the light emitting device 1A (the light emitted in the direction of arrow A) has a primary light (blue light $B_1$) and a secondary light (yellow light $Y_1$).

In the light emitting device 1A, the light emitted from the upper surface 20u of the light emitting element 20 to the outside of the light emitting device 1A with a certain angle θ (the light emitted in the direction of arrow B) has a primary light (blue light $B_2$) emitted from the light emitting unit 20a of the light emitting element 20 with the angle θ and a secondary light (yellow light $Y_2$).

Here, if the light quantity ratio ($I_{B2}/I_{Y2}$) between the primary light and the secondary light emitted with the angle θ is equal to the light quantity ratio ($I_{B1}/I_{Y2}$), also the light emitted from the upper surface 20u of the light emitting element 20 to the outside of the light emitting device 1A with the certain angle θ has a color substantially the same as the light emitted perpendicularly from the upper surface 20u of the light emitting element 20 to the outside of the light emitting device 1A.

Also in the light emitting device 1A, the primary light emitted in the direction of arrow B passes through a longer path in the fluorescent body-containing layer 30 than the primary light emitted in the direction of arrow A. Accordingly, in the direction of arrow B, the primary light may be more absorbed in the fluorescent material than in the direction of arrow A, and the secondary light (yellow light $Y_2$) may be stronger than the secondary light (yellow light $Y_1$) ($Y_2 > Y_1$).

However, in the light emitting device 1A, the area of the lower surface 30d of the fluorescent body-containing layer 30 is smaller than the area of the light emitting unit 20a of the light emitting element 20. Here, is provided on part of the light emitting unit 20a. The cross section of the fluorescent body-containing layer 30 is an inverted trapezoid, and the transparent resin layer 50 is in contact with the side surface 30w of the fluorescent body-containing layer 30. That is, the transparent resin layer 50 has a surface from which light can be extracted.

Therefore, in the primary light emitted from the periphery of the light emitting unit 20a, there is a primary light that directly reaches the surface 50s of the transparent resin layer 50 without passing through the fluorescent body-containing layer 30 and is emitted as it is to the outside of the light emitting device 1A. In other words, in the primary light emitted from the periphery of the light emitting unit 20a, there is a primary light that is not color-converted and is emitted as it is to the outside of the light emitting device 1A. In FIG. 3A, that primary light is shown as blue light $B_3$ (arrow C).

Thereby, in the light emitting device 1A, even when the angle θ becomes wider and the light quantity of the secondary light (yellow light $Y_2$) becomes larger, the primary light emitted in the direction of arrow C (blue light $B_3$) supplements the light quantity of blue light. Consequently, even when the angle θ is a wide angle, the balance between the primary light and the secondary light is less likely to be broken.

As shown in FIG. 3B, in the light emitting device 1A, the (chromaticity x) near the angle of 0 degrees and the (chromaticity x) near the angle of 90 degrees are almost the same value, for example. This means that the color inclines neither to blue nor to yellow, and both colors are emitted with good balance at angles θ ranging from −90 degrees to 90 degrees. That is, in the light emitting device 1A, color breakup is suppressed as compared to the reference example. The Δ(chromaticity x) is 0.04 or less, for example.

The light emitting device is not limited to the light emitting device 1A, and also light emitting devices illustrated below are possible.

Figure 4A:
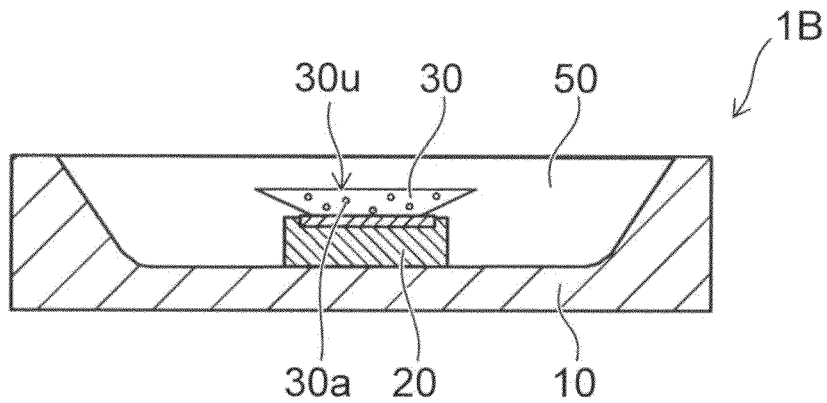
FIG. 4A to FIG. 4C are schematic cross-sectional views of other light emitting devices according to the first embodiment.
Figure 4B:
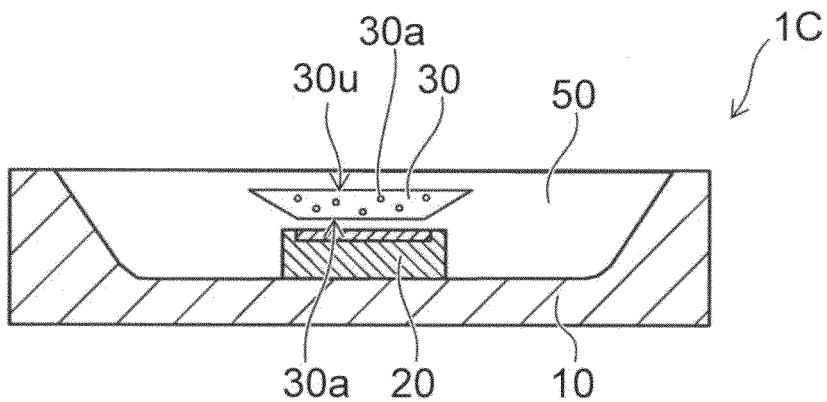
Figure 4C:
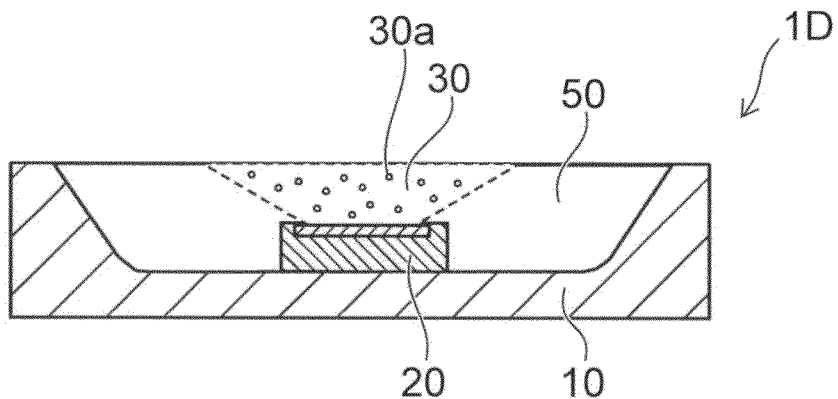

FIG. 4A to FIG. 4C are schematic cross-sectional views of other light emitting devices according to the first embodiment.

Like a light emitting device 1B shown in FIG. 4A, the upper surface 30u of the fluorescent body-containing layer 30 may be covered with the transparent resin layer 50, for example. Also such a structure exhibits the same operation and effect as the light emitting device 1A. In the light emitting device 1B, the transparent resin layer 50 serves as a protection film that protects the fluorescent body-containing layer 30.

Like a light emitting device 1C shown in FIG. 4B, also a structure is possible in which the upper surface 30u of the fluorescent body-containing layer 30 is covered with the transparent resin layer 50, and the fluorescent body-containing layer 30 and the light emitting element 20 are apart. Also such a structure exhibits the same operation and effect as the light emitting device 1A. In the light emitting device 1C, the fluorescent body-containing layer 30 is apart from the light emitting element 20. Therefore, the fluorescent body-containing layer 30 is less likely to be influenced by the heat radiated from the light emitting element 20.

Like a light emitting device 1D shown in FIG. 4C, the fluorescent body-containing layer 30 may be formed by directly dispersing the fluorescent material 30a in the transparent resin layer 50. Also such a structure exhibits the same operation and effect as the light emitting device 1A.

Figure 5A:
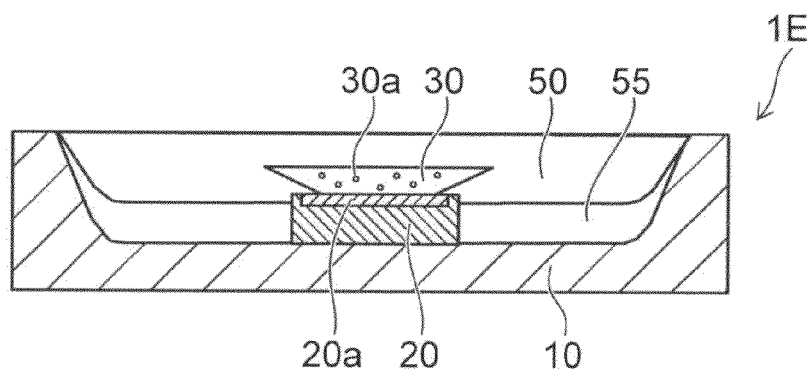
FIG. 5A is a schematic cross-sectional view of still another light emitting device according to the first embodiment.
Figure 5B:
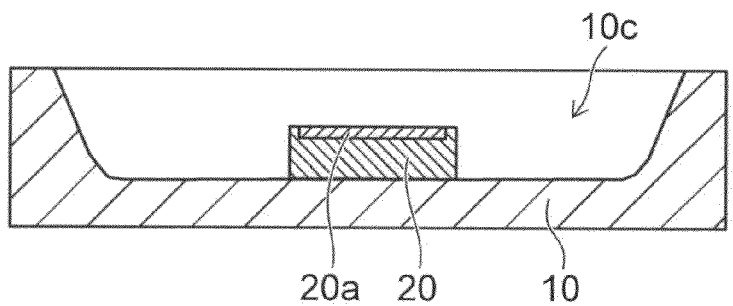
FIG. 5B to FIG. 5D are schematic cross-sectional views showing the manufacturing process of the still another light emitting device according to the first embodiment.
Figure 5C:
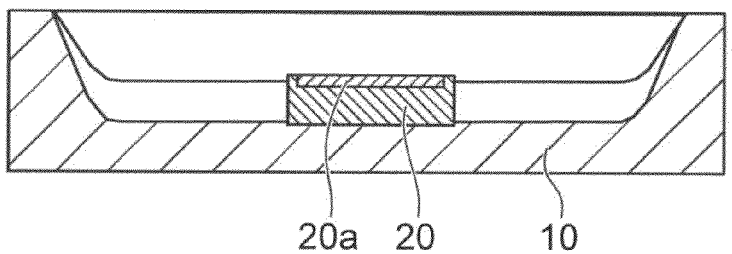
Figure 5D:
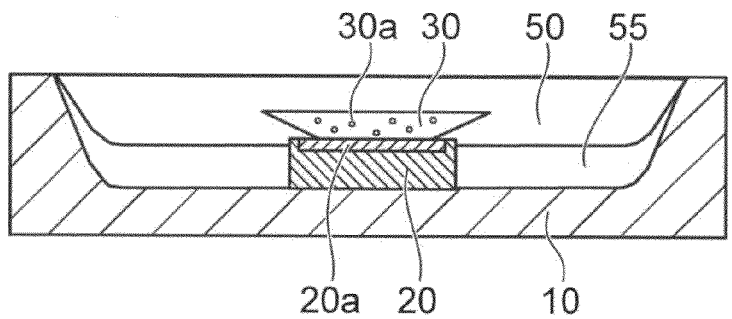

FIG. 5A is a schematic cross-sectional view of still another light emitting device according to the first embodiment, and FIG. 5B to FIG. 5D are schematic cross-sectional views showing the manufacturing process of this light emitting device according to the first embodiment.

A light emitting device 1E shown in FIG. 5A includes a reflection layer 55 between the transparent resin layer 50 and the base 10. In the reflection layer 55, a filler material (for example, inorganic fine particles and/or organic fine particles) having a high reflectance is dispersed.

In the case where, for example, the material of the base 10 is a metal such as copper (Cu) with its surface plated with silver (Ag), the light reflectance at the bottom surface of the recess 10c of the base 10 may be reduced. However, as shown in FIG. 5A, by providing the reflection layer 55 between the transparent resin layer 50 and the base 10, the primary light and the secondary light are reflected at the surface of the reflection layer 55 with good efficiency. Thereby, in the light emitting device 1D, the light emission efficiency as a light emitting device is increased.

In the light emitting device 1E, the light emitting element 20 is installed in the recess 10c of the base 10 as shown in FIG. 5B, and then the reflection layer 55 containing a filler material is formed in the recess 10c by the potting method as shown in FIG. 5C, for example. In this stage, part of the side surface of the light emitting element 20 is in contact with the reflection layer 55.

Next, as shown in FIG. 5D, the fluorescent body-containing layer 30 is formed on the light emitting element 20. For example, the fluorescent body-containing layer 30 in a sheet form is installed on the upper surface of the light emitting element 20. After that, the transparent resin layer 50 is formed on the reflection layer 55. Also such an embodiment is included in the embodiment.

The Δ(chromaticity x) of the light emitting device according to the first embodiment is further described in detail.

Figure 6:
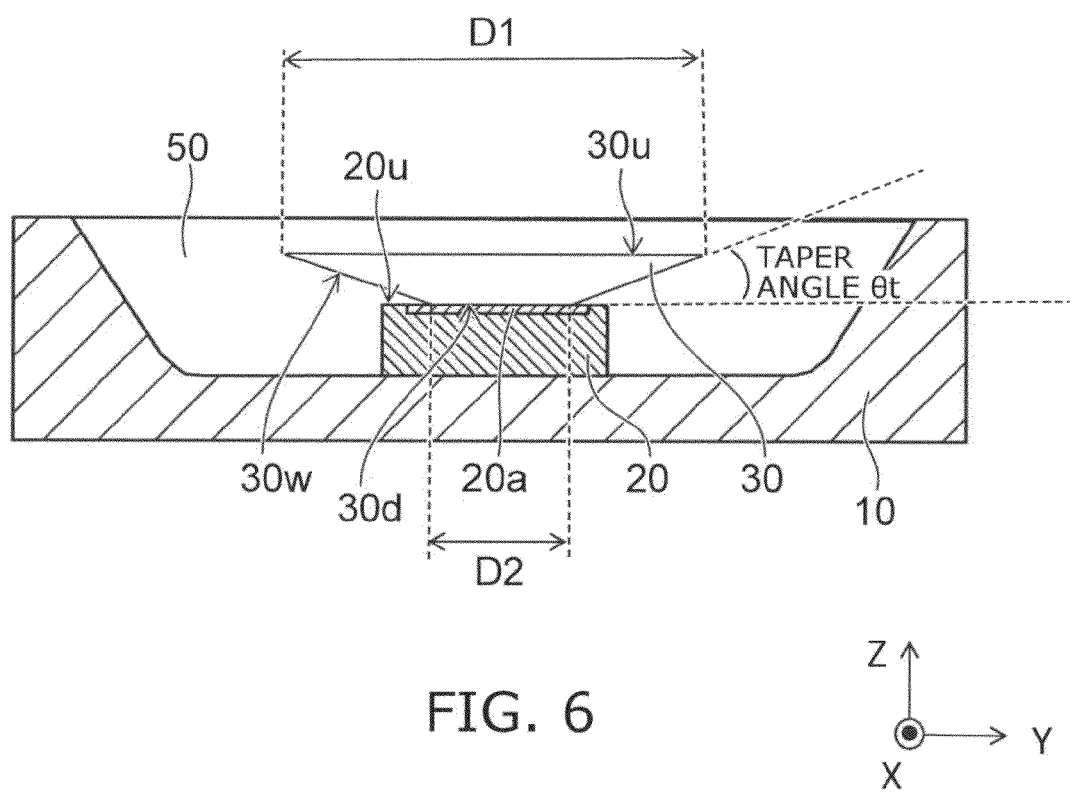
FIG. 6 is a schematic cross-sectional view of the light emitting device according to the first embodiment.

FIG. 6 is a schematic cross-sectional view of the light emitting device according to the first embodiment.

FIG. 6 illustrates the light emitting device 1B described above, for example. Here, in the cross section of the light emitting device 1B, the width of the upper surface 30u of the fluorescent body-containing layer 30 is denoted by D1, and the width of the lower surface 30d is denoted by D2. The taper angle between the side surface 30w of the fluorescent body-containing layer 30 and the upper surface 20u of the light emitting element 20 is denoted by et. It is assumed that the thickness of the fluorescent body-containing layer 30 is 150 μm and the thickness of the transparent resin layer 50 is 300 μm, as an example.

The Δ(chromaticity x) described above is controlled to a very small value by adjusting the upper surface 30u and the lower surface 30d of the fluorescent body-containing layer 30, or adjusting the upper surface 30u of the fluorescent body-containing layer 30 and the taper angle et. The Δ(chromaticity x) may be replaced with the Δ(chromaticity y).

Figure 7A:
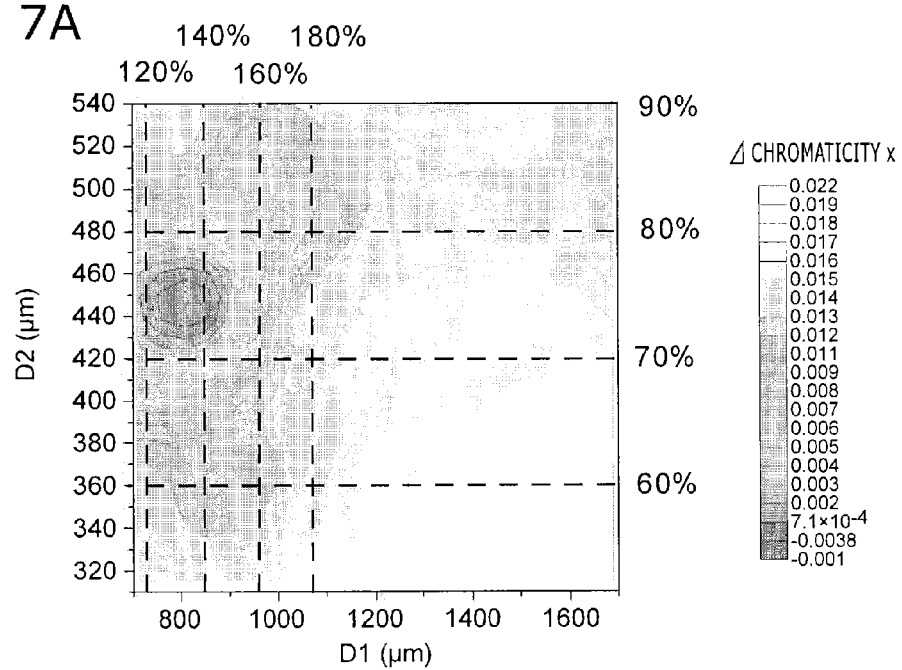
FIG. 7A is a graph showing the relationships between the width of the upper surface and the width of the lower surface of the fluorescent body-containing layer and the Δ(chromaticity x)
Figure 7B:
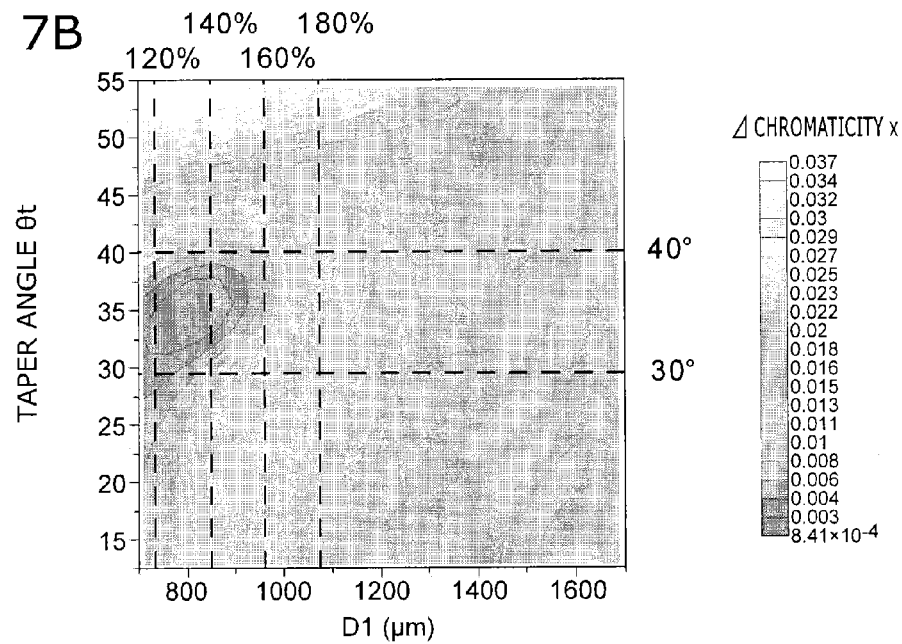
FIG. 7B is a graph showing the relationships between the width of the upper surface of the fluorescent body-containing layer and the taper angle, and the Δ(chromaticity x)

FIG. 7A is a graph showing the relationships between the width of the upper surface and the width of the lower surface of the fluorescent body-containing layer and the Δ(chromaticity x), and FIG. 7B is a graph showing the relationships between the width of the upper surface of the fluorescent body-containing layer and the taper angle, and the Δ(chromaticity x).

The horizontal axis on the lower side of FIG. 7A represents the width D1 (μm) of the upper surface 30u. The horizontal axis on the upper side represents the proportion (%) of the area of the upper surface 30u to the light emitting unit 20a. The vertical axis on the left side of FIG. 7A represents the width D2 (μm) of the lower surface 30d. The vertical axis on the right side represents the proportion (%) of the area of the lower surface 30d to the light emitting unit 20a.

In FIG. 7A, the Δ(chromaticity x) at a prescribed width D1 and a prescribed width D2 is expressed by the gray scale. Here, as the color becomes deeper, the Δ(chromaticity x) becomes lower. The correspondence between the depth of color and the Δ(chromaticity x) value is shown on the right side of the graph.

As shown in FIG. 7A, it is preferable that the area of the lower surface 30d of the fluorescent body-containing layer 30 be not less than 70% and not more than 80% of the area of the light emitting unit 20a, and that the area of the upper surface 30u of the fluorescent body-containing layer 30 be not less than 110% and not more than 160% of the area of the light emitting unit 20a. When the area of the lower surface 30d of the fluorescent body-containing layer 30 is not less than 70% and not more than 80% and the area of the upper surface 30u of the fluorescent body-containing layer 30 is not less than 110% and not more than 160%, the Δ(chromaticity x) is 0.015 or less, which is a very small Δ(chromaticity x).

The horizontal axis on the lower side of FIG. 7B represents the width D1 (μm) of the upper surface 30u. The horizontal axis on the upper side represents the proportion (%) of the area of the upper surface 30u to the light emitting unit 20a. The vertical axis on the left side of FIG. 7B represents the taper angle θt. The vertical axis on the right side represents the proportion (%) of the area of the lower surface 30d to the light emitting unit 20a.

Similarly, in FIG. 7B, the Δ(chromaticity x) at a prescribed width D1 and a prescribed taper angle et is expressed by the gray scale.

As shown in FIG. 7B, it is preferable that the area of the upper surface 30u of the fluorescent body-containing layer 30 be not less than 110% and not more than 180% of the area of the light emitting unit 20a, and that the angle et between the side surface 30w of the fluorescent body-containing layer 30 and the light emitting unit 20a be not less than 30 degrees and not more than 40 degrees. When the area of the upper surface 30u of the fluorescent body-containing layer 30 is not less than 110% and not more than 180% and the taper angle et is not less than 30 degrees and not more than 40 degrees, the Δ(chromaticity x) is 0.015 or less, which is a very small Δ(chromaticity x).

Second Embodiment

Figure 8A:
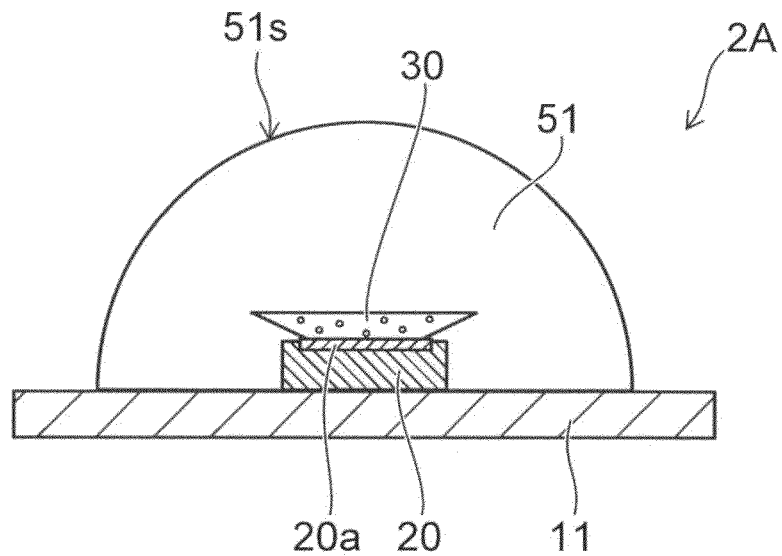
FIG. 8A and FIG. 8B are schematic cross-sectional views of light emitting devices according to a second embodiment.
Figure 8B:
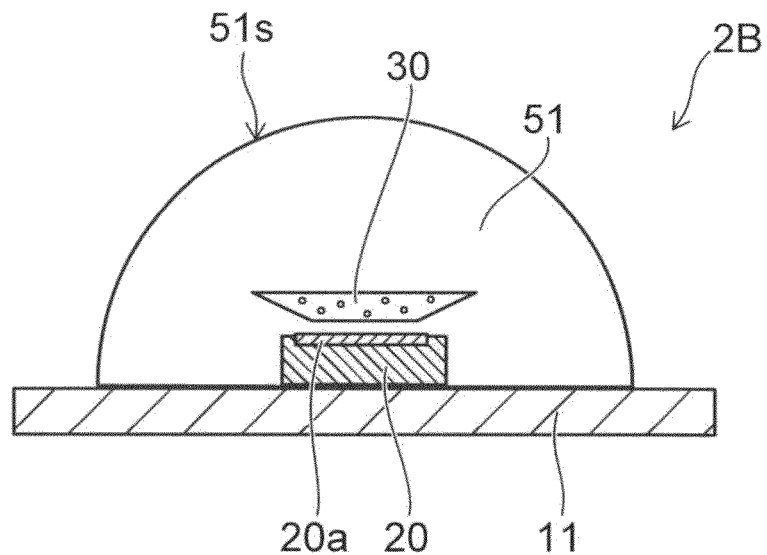

FIG. 8A and FIG. 8B are schematic cross-sectional views of light emitting devices according to a second embodiment.

The light emitting device is not limited to a flat-type light emitting device, and may be what is called a lens-type light emitting device shown in FIGS. 8A and 8B.

A light emitting device 2A shown in FIG. 8A includes the light emitting element 20 and the fluorescent body-containing layer 30. The light emitting element 20 is provided on a base 11. The material of the base 11 is a ceramic material, a resin material, a metal, or others, for example. A lens layer 51 in a hemispherical shape is provided on the base 11. The lens layer 51 covers the light emitting element 20 and the fluorescent body-containing layer 30.

Examples of the material of the lens layer 51 include a silicone-based resin, an epoxy resin, a methacrylic resin (PMMA), a polycarbonate (PC), a cyclic polyolefin (COP), an alicyclic acrylic (OZ), a thermosetting resin for lenses of glasses (ADC), an acrylic-based resin, and a fluorine-based resin. The material may contain silicon oxide ($SiO_2$), titanium oxide ($TiO_2$), or the like.

Also in the light emitting device 2A, the area of the lower surface 30d of the fluorescent body-containing layer 30 is smaller than the area of the light emitting unit 20a of the light emitting element 20. Here, the fluorescent body-containing layer is provided on part of the light emitting unit 20a of the light emitting element 20, and the lens layer 51 is in contact with part of the light emitting unit 20a. Therefore, in the primary light emitted from the periphery of the light emitting unit 20a, there is a primary light that directly reaches the surface 51s of the lens layer 51 without passing through the fluorescent body-containing layer 30 and is emitted as it is to the outside of the light emitting device 2A. Thereby, also the light emitting device 2A exhibits the same effect as the light emitting device 1A.

Like a light emitting device 2B shown in FIG. 8B, also a structure in which the fluorescent body-containing layer 30 and the light emitting element 20 are apart is possible. In such a structure, the same operation and effect as the light emitting device 1A are exhibited, and furthermore the fluorescent body-containing layer 30 is less likely to be influence by the heat radiated from the light emitting element 20.

In the embodiments described above, "on" in "region A is provided on "region B" means the case where the "region A contacts the "region B and the "region A is provided on the "region B and the case where the "region A does not contact the "region B and the "region A is provided above the "region B. "Region A is provided on "region B" may include the case where the "region A and the "region B are reversed and the "region A is located below the region B and the case where the "region A is arranged along with the "region B.

Although the embodiments are described above with reference to the specific examples, the embodiments are not limited to these specific examples. That is, design modification appropriately made by a person skilled in the art in regard to the embodiments is within the scope of the embodiments to the extent that the features of the embodiments are included. Components and the disposition, the material, the condition, the shape, and the size or the like included in the specific examples are not limited to illustrations and can be changed appropriately.

The components included in the embodiments described above can be combined to the extent of technical feasibility and the combinations are included in the scope of the embodiments to the extent that the feature of the embodiments is included. Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A light emitting device comprising:
   a base having a recess;
   a light emitting element installed on the base, the light emitting element having an upper surface and a lower surface, the light emitting element including a light emitting unit on the upper surface; and
   a fluorescent body-containing layer provided on the light emitting element the fluorescent body-containing layer having a lower surface, the lower surface having an area smaller than an area of the light emitting unit the fluorescent body-containing layer having an upper surface, the upper surface having an area larger than the area of the light emitting unit, the fluorescent body-containing layer being provided in the recess of the base.

2. The light emitting device according to claim 1, wherein an upper surface of the fluorescent body-containing layer is covered with a transparent resin layer.

3. The light emitting device according to claim 1, wherein the fluorescent body-containing layer and the light emitting element are apart.

4. The light emitting device according to claim 1, wherein
   an area of the lower surface of the fluorescent body-containing layer is not less than 70% and not more than 80% of an area of the light emitting unit and
   an area of the upper surface of the fluorescent body-containing layer is not less than 110% and not more than 160% of an area of the light emitting unit.

5. The light emitting device according to claim 1, wherein
   an area of the upper surface of the fluorescent body-containing layer is not less than 110% and not more than 180% of an area of the light emitting unit and
   an angle between a side surface of the fluorescent body-containing layer and the light emitting unit is not less than 30 degrees and not more than 40 degrees.

6. The light emitting device according to claim 1, wherein
   the light emitting element is provided in the recess,
   the light emitting device further includes a transparent resin layer provided in the recess and being in contact with a side surface of the fluorescent body-containing layer, and
   light emitted from the light emitting unit is allowed to reach a surface of the transparent resin layer without passing through the fluorescent body-containing layer.

7. The light emitting device according to claim 6, wherein heights of the transparent resin layer and the fluorescent body-containing layer from a bottom of the base are same.

8. The light emitting device according to claim 6, wherein an upper surface of the fluorescent body-containing layer is covered with the transparent resin layer.

9. The light emitting device according to claim 6, further comprising a reflection layer between the base and the transparent resin layer.

10. The light emitting device according to claim 9, wherein the reflection layer is in contact with a side surface of the light emitting element.

11. The light emitting device according to claim 10, wherein a filler material is dispersed in the reflection layer.

12. The light emitting device according to claim 1, wherein the light emitting element is provided in the recess,
the light emitting device further includes a transparent resin layer provided in the recess and being in contact with a side surface of the fluorescent body-containing layer,
the fluorescent body-containing layer is provided on a part of the light emitting unit of the light emitting element, and
the transparent resin layer is in contact with the part of the light emitting unit.

13. The light emitting device according to claim 12, wherein heights of the transparent resin layer and the fluorescent body-containing layer from a bottom of the base are same.

14. The light emitting device according to claim 1, wherein the light emitting element is provided in the recess, and
the fluorescent body-containing layer is a part of a transparent resin layer provided in the recess.

15. The light emitting device according to claim 14, wherein light emitted from the light emitting unit is allowed to reach a surface of the transparent resin layer other than the fluorescent body-containing layer without passing through the fluorescent body-containing layer.

16. The light emitting device according to claim 14, wherein the fluorescent body-containing layer is provided on a part of the light emitting unit of the light emitting element.

17. A light emitting device comprising:
a base;
a light emitting element installed on the base, the light emitting element having an upper surface and a lower surface, the light emitting element including a light emitting unit on the upper surface;
a fluorescent body-containing layer provided on the light emitting element, the fluorescent body-containing layer having a lower surface, the lower surface having an area smaller than an area of the light emitting unit, the fluorescent body-containing layer having an upper surface, the upper surface having an area larger than the area of the light emitting unit; and
a lens layer covering the light emitting element and the fluorescent body-containing layer,
light emitted from the light emitting unit being allowed to reach a surface of the lens layer without passing through the fluorescent body-containing layer.

18. The light emitting device according to claim 17, wherein the fluorescent body-containing layer and the light emitting element are apart.

19. A light emitting device comprising:
a base;
a light emitting element installed on the base, the light emitting element having an upper surface and a lower surface, the light emitting element including a light emitting unit on the upper surface;
a fluorescent body-containing layer provided on the light emitting element, the fluorescent body-containing layer having a lower surface, the lower surface having an area smaller than an area of the light emitting unit, the fluorescent body-containing layer having an upper surface, the upper surface having an area larger than the area of the light emitting unit; and
a lens layer covering the light emitting element and the fluorescent body-containing layer,
the fluorescent body-containing layer being provided on a part of the light emitting unit of the light emitting element,
the lens layer being in contact with the part of the light emitting unit,
the fluorescent body-containing layer and the light emitting element being apart.

* * * * *